(12) United States Patent
Shen

(10) Patent No.: US 6,670,707 B2
(45) Date of Patent: Dec. 30, 2003

(54) INTEGRATED CIRCUIT CHIP

(76) Inventor: Ming-Tung Shen, 4F, No. 52, Sec. 2, Chung-Shan N. Rd., Taipei (TW)

( * ) Notice: Subject to any disclaimer, the term of this patent is extended or adjusted under 35 U.S.C. 154(b) by 0 days.

(21) Appl. No.: 09/791,076

(22) Filed: Feb. 22, 2001

(65) Prior Publication Data

US 2001/0008307 A1 Jul. 19, 2001

Related U.S. Application Data

(62) Division of application No. 09/303,142, filed on Apr. 30, 1999.

(30) Foreign Application Priority Data

Oct. 27, 1998 (TW) .......................................... 87117753 A

(51) Int. Cl.⁷ ............................................... H01L 23/48
(52) U.S. Cl. ........................ 257/734; 257/690; 257/784; 257/723
(58) Field of Search ................................. 257/734, 680, 257/687, 690, 679, 784, 787, 723, 666; 438/617, 106; 174/255

(56) References Cited

U.S. PATENT DOCUMENTS

| | | | | |
|---|---|---|---|---|
| 5,243,497 A | * | 9/1993 | Chiu | 361/783 |
| 5,384,689 A | * | 1/1995 | Shen | 361/761 |
| 5,502,289 A | * | 3/1996 | Takiar et al. | 174/266 |
| 5,677,566 A | * | 10/1997 | King et al. | 257/666 |
| 5,723,907 A | * | 3/1998 | Akram | 257/723 |
| 5,739,585 A | * | 4/1998 | Akram et al. | 257/698 |
| 5,777,381 A | * | 7/1998 | Nishida | 257/693 |
| 5,811,879 A | * | 9/1998 | Akram | 257/723 |
| 5,818,698 A | * | 10/1998 | Corisis | 361/760 |
| 5,952,611 A | * | 9/1999 | Eng et al. | 174/52.4 |
| 5,998,860 A | * | 12/1999 | Chan et al. | 257/679 |
| 5,998,865 A | * | 12/1999 | Akram | 257/723 |
| 6,107,683 A | * | 8/2000 | Castro et al. | 257/700 |

* cited by examiner

*Primary Examiner*—David L. Talbott
*Assistant Examiner*—Lourdes Cruz
(74) *Attorney, Agent, or Firm*—Marshall & Melhorn, LLC

(57) ABSTRACT

An integrated circuit chip including a circuit board unit and a plurality of contact pads on a top surface of the unit. A die having a plurality of solder pads is positioned adjacent the circuit board unit with the solder pads wire-bonded to the contact pads. A lead frame having connecting leads is positioned on the circuit board unit with the leads connected to the solder pads via a conductive contact layer. A plastic layer encapsulates the circuit board unit and at least a portion with the lead frame.

14 Claims, 12 Drawing Sheets

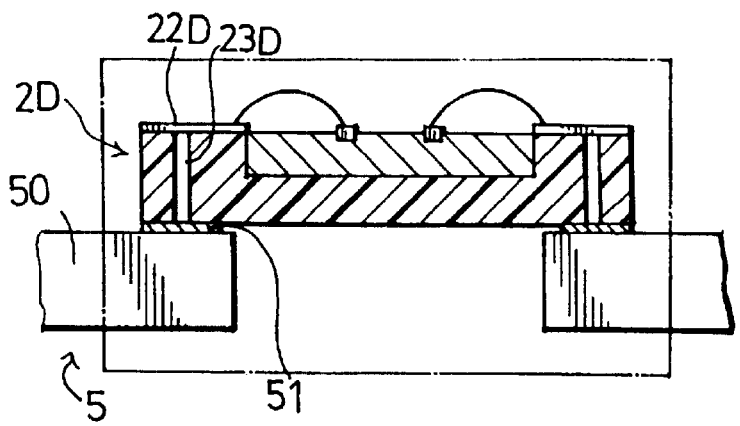
F I G. 6
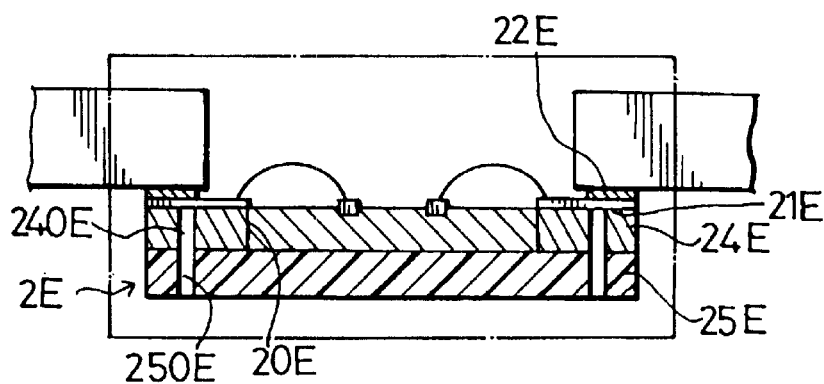
F I G. 7
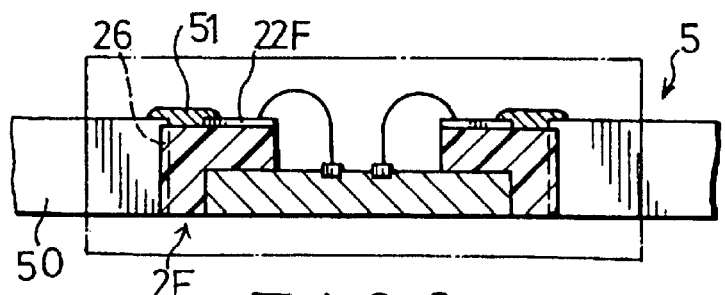
F I G. 8

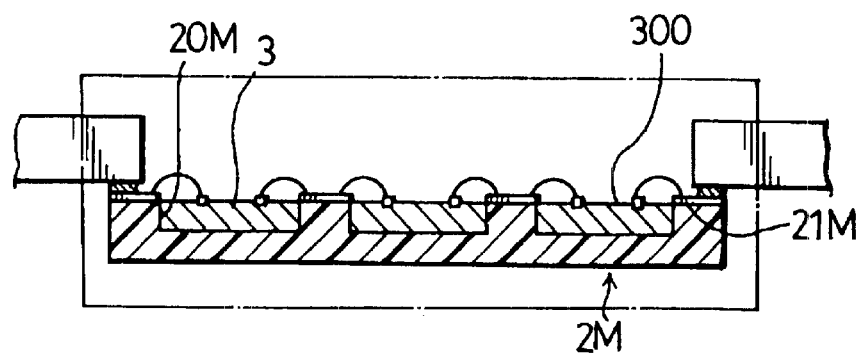
F I G. 15
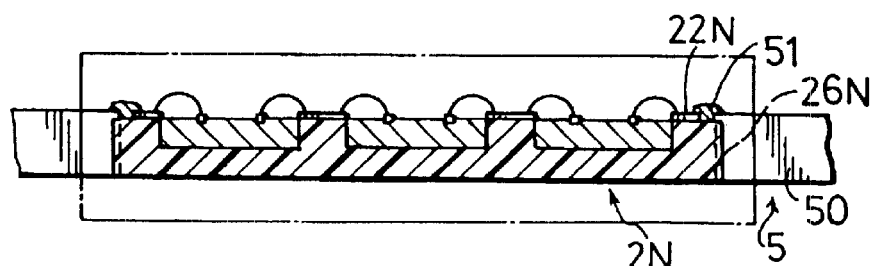
F I G. 16
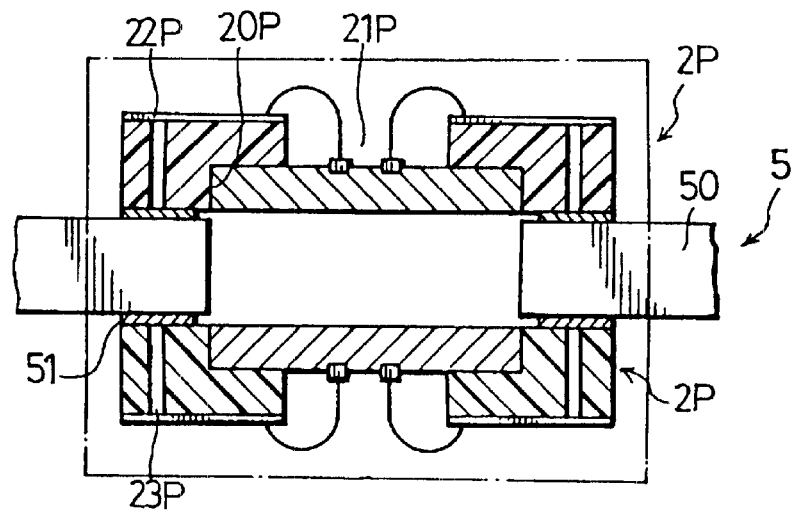
F I G. 17

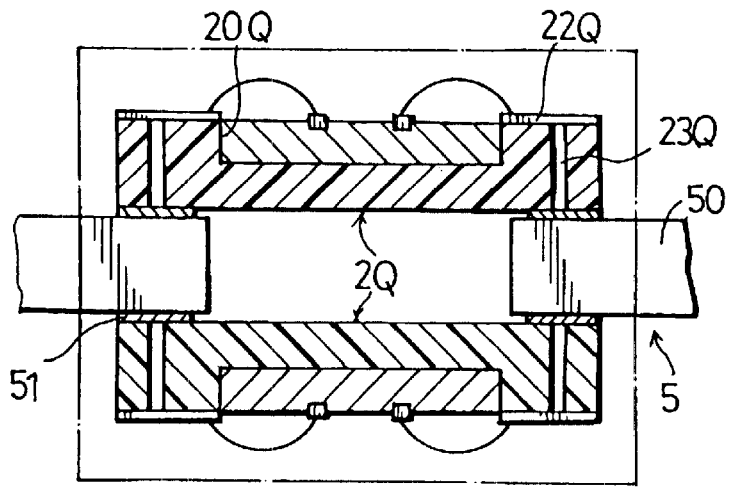
F I G. 18
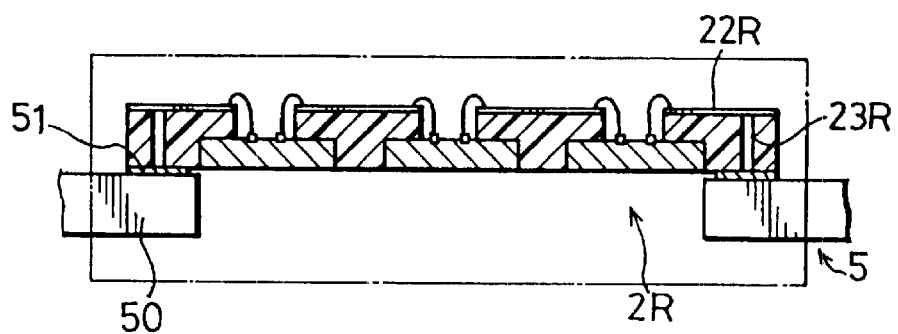
F I G. 19
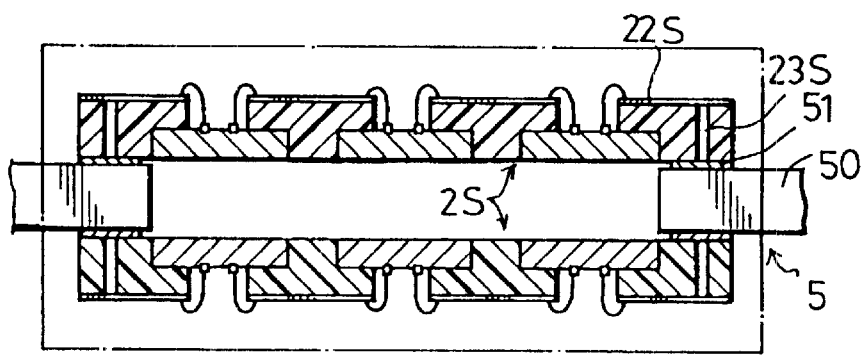
F I G. 20

INTEGRATED CIRCUIT CHIP

CROSS REFERENCE TO RELATED APPLICATIONS

This application is a Division of application Ser. No. 09/303,142 filed Apr. 30, 1999.

BACKGROUND OF THE INVENTION

1. Field of the Invention

The invention relates to an integrated circuit chip and a method for fabricating the same, more particularly to an integrated circuit chip and a method for fabricating the same that can reduce production costs and that can increase production capacity.

2. Description of the Related Art

Referring to FIGS. 1A to 1C, a conventional method for fabricating an integrated circuit chip is shown. As shown in FIG. 1A, a die 10 having an upper surface provided with a plurality of solder pads 100 is attached to a tie bar 130 on a lead frame 13 by means of a double-side adhesive tape 12 to fix the die 10 on the lead frame 13. The solder pads 100 are exposed via a bore 1300 formed in the tie bar 130, as shown in FIG. 1D. Referring to FIG. 1B, each of the solder pads 100 is connected electrically to a respective lead 131 of the lead frame 13 via known wire bonding techniques by means of a conductive wire 14 that extends through the bore 1300. Referring to FIG. 1C, a plastic protective layer 15 is used to encapsulate the die 10 and a portion of the lead frame 13 to form an integrated circuit chip.

The following are some of the drawbacks of the conventional method for fabricating an integrated circuit chip:

1. The aforesaid method needs different kinds of lead frames for different kinds of packaging, such as TSOP, SOJ, QFP, SOP and so on. Thus, at least one mold is prepared for each customer, thereby increasing costs.
2. In the aforesaid method, double-side adhesive tape is needed to secure the die on the tie bar, thereby increasing the fabricating costs.
3. In the aforesaid method, it will take a long time to form the molds for the lead frames, thereby affecting the ability of manufacturers to compete.

SUMMARY OF THE INVENTION

Therefore, the main object of the present invention is to provide an integrated circuit chip and a method for fabricating the same which can overcome the drawbacks associated with the aforesaid prior art.

According to this invention, a method for fabricating an integrated circuit chip comprises:

(a) forming a circuit board unit with a die-receiving cavity, and a plurality of contact pads on a top surface of the circuit board unit;
(b) forming a die having an upper surface provided with a plurality of solder pads;
(c) placing the die in the die-receiving cavity such that the solder pads on the die are exposed;
(d) wire-bonding the solder pads to the contact pads via conductive wires;
(e) placing a lead frame on the circuit board unit, and connecting leads on the lead frame to corresponding ones of the contact pads via a conductive contact layer; and
(f) forming a plastic protective layer to encapsulate the circuit board unit and at least a portion of the lead frame.

BRIEF DESCRIPTION OF THE DRAWINGS

Other features and advantages of the present invention will become apparent in the following detailed description of the preferred embodiments with reference to the accompanying drawings, of which:

FIG. 6 is a fragmentary schematic, partly sectional view showing the fifth preferred embodiment of this invention.

FIG. 7 is a fragmentary schematic, partly sectional view showing the sixth preferred embodiment of this invention.

FIG. 8 is a fragmentary schematic, partly sectional view showing the seventh preferred embodiment of this invention.

FIG. 15 is a fragmentary schematic, partly sectional view showing the thirteenth preferred embodiment of this invention.

FIG. 16 is a fragmentary schematic, partly sectional view showing the fourteenth preferred embodiment of this invention.

FIG. 17 is a fragmentary schematic, partly sectional view showing the fifteenth preferred embodiment of this invention.

FIG. 18 is a fragmentary schematic, partly sectional view showing the sixteenth preferred embodiment of this invention.

FIG. 19 is a fragmentary schematic, partly sectional view showing the seventeenth preferred embodiment of this invention.

FIG. 20 is a fragmentary schematic, partly sectional view showing the eighteenth preferred embodiment of this invention.

DETAILED DESCRIPTION OF THE PREFERRED EMBODIMENTS

Figure 1A:
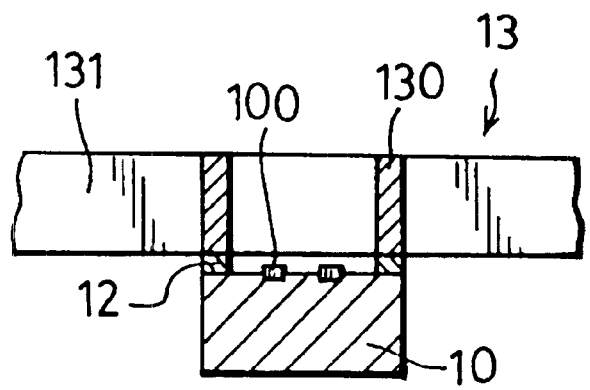
FIGS. 1A to 1C are fragmentary schematic, partly sectional views showing a conventional method for fabricating an integrated circuit chip.
Figure 1B:
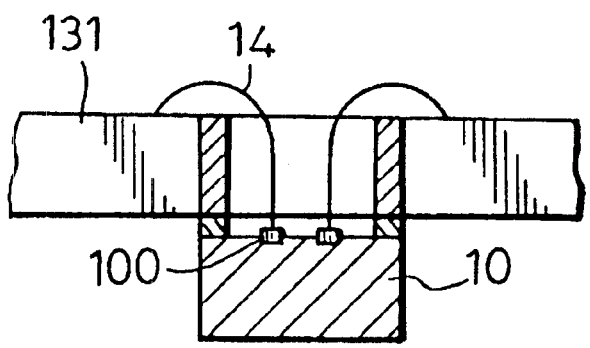
Figure 1C:
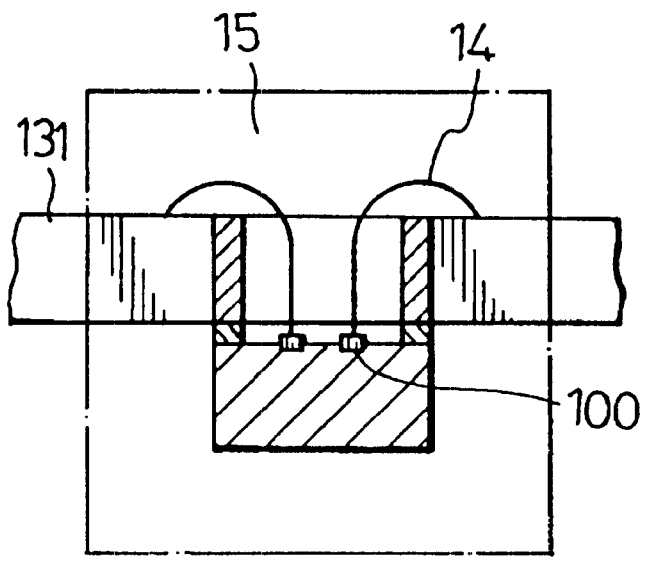
Figure 1D:
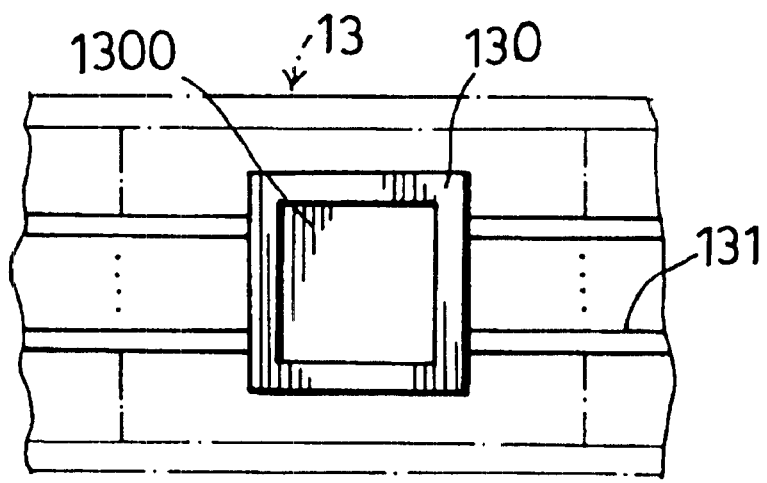
FIG. 1D is a fragmentary top view showing a lead frame used in the conventional method for fabricating an integrated circuit chip.

Before the present invention is described in greater detail, it should be noted that like elements are denoted by the same reference numerals throughout the disclosure.

Figure 2A:
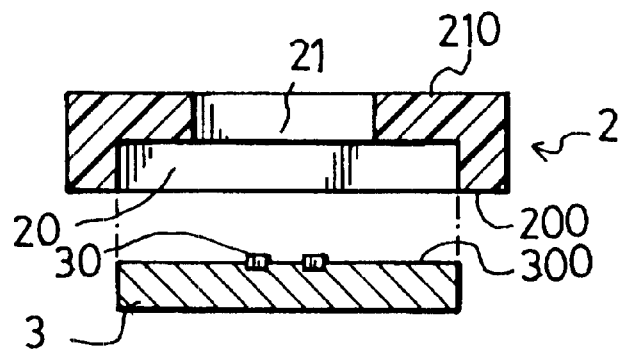
FIGS. 2A to 2D are fragmentary schematic, partly sectional views showing the first preferred embodiment of a method for fabricating an integrated circuit chip of this invention.
Figure 2B:
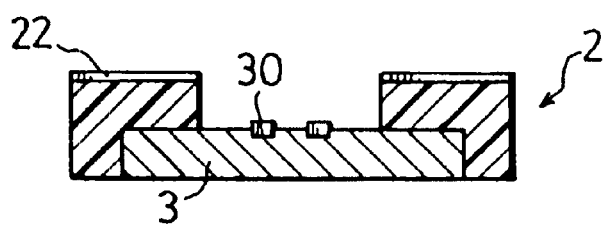
Figure 2C:
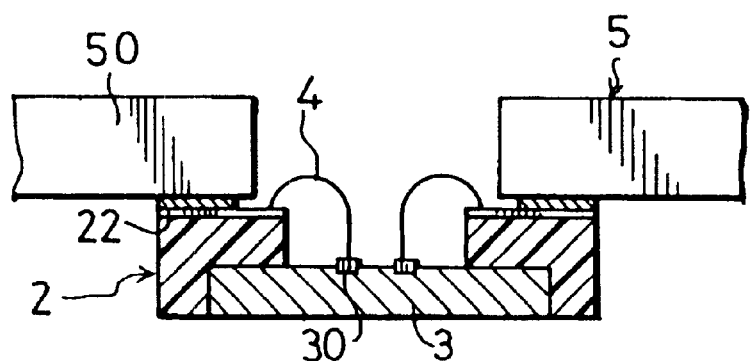
Figure 2D:
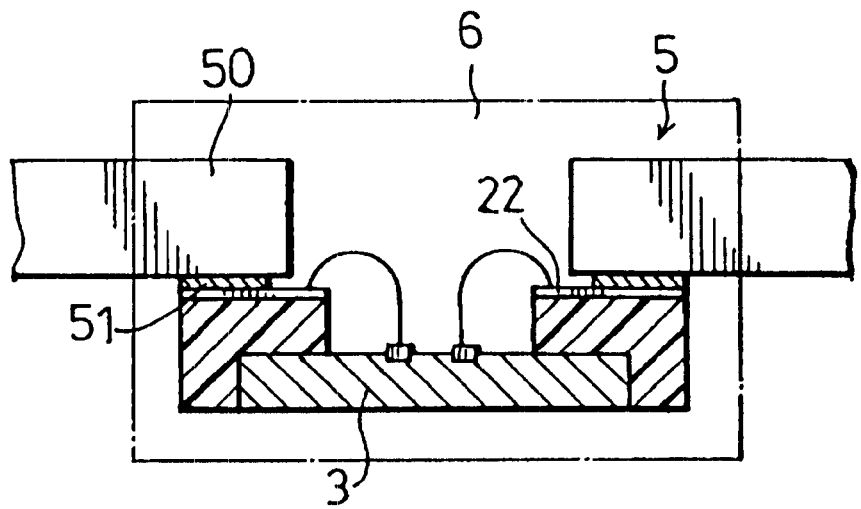
Figure 2E:
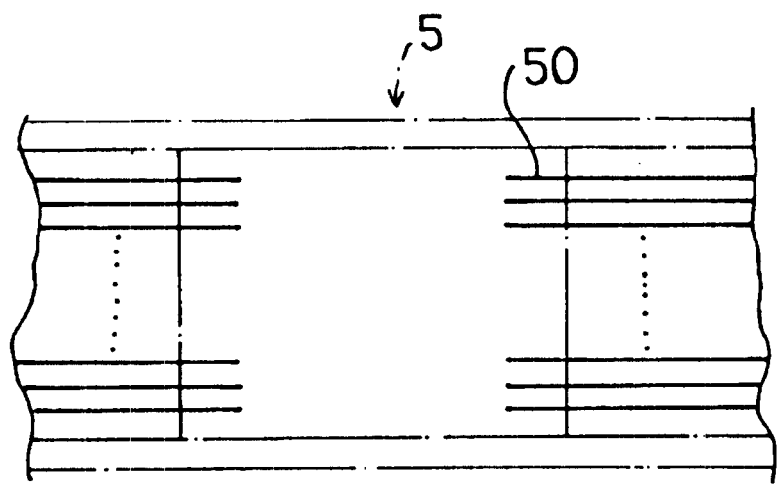
FIG. 2E is a fragmentary top view showing a lead frame used in the first preferred embodiment of this invention.

Referring to FIGS. 2A to 2E, according to the first preferred embodiment of this invention, an integrated circuit chip includes a circuit board unit 2, a die 3, a plurality of conductive wires 4, a lead frame 5, a conductive contact layer 51, and a plastic protective layer 6. Referring to FIGS. 2A and 2B, the circuit board unit 2 has a bottom surface 200 formed with a die-receiving cavity 20, a top surface 210 formed with a bore 21 to access the die-receiving cavity 20, and a plurality of contact pads 22 on the top surface 210 of the circuit board unit 2. The die 3 has an upper surface 300 provided with a plurality of solder pads 30. The die 3 is placed inside the die-receiving cavity 20 such that the solder pads 30 are exposed via the bore 21 in the circuit board unit 2. Referring to FIG. 2C, the conductive wires 4 extend through the bore 21 and wire-bond the solder pads 30 to the contact pads 22. Referring to FIGS. 2C and 2D, the lead frame 5 is placed on top of the circuit board unit 2. The lead frame 5 has a plurality of leads 50. The conductive contact layer 51 is disposed between the lead frame 5 and the circuit board unit 2 to bond the leads 50 on the lead frame 5 onto corresponding ones of the contact pads 22. The conductive contact layer 51 is formed from a silver epoxy, such as one that contains both tin and lead, or solder paste that contains tin. The plastic protective layer 6 is used to encapsulate the circuit board unit 2 and at least a portion of the lead frame 5, as shown in FIG. 2E.

Figure 3:
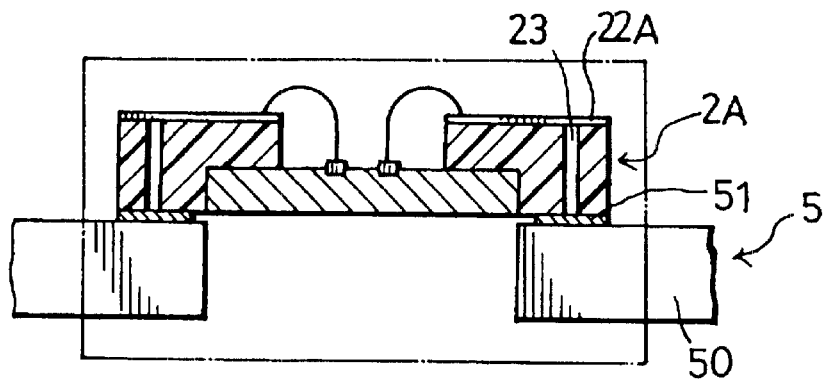
FIG. 3 is a fragmentary schematic, partly sectional view showing the second preferred embodiment of this invention.

FIG. 3 illustrates the second preferred embodiment of this invention, which is based on the first preferred embodiment. In FIG. 3, unlike the first preferred embodiment shown in of FIG. 2D, the circuit board unit 2A is further formed with a plurality of electroplated holes 23 registered respectively with the contact pads 22A and extending through a bottom surface of the circuit board unit 2A. The lead frame 5 is placed below the circuit board unit 2A. The conductive contact layer 51 is disposed between the lead frame 5 and the circuit board unit 2A to bond leads 50 on the lead frame 5 onto the electroplated holes 23 to establish electrical connection with corresponding ones of the contact pads 22A.

Figure 4:
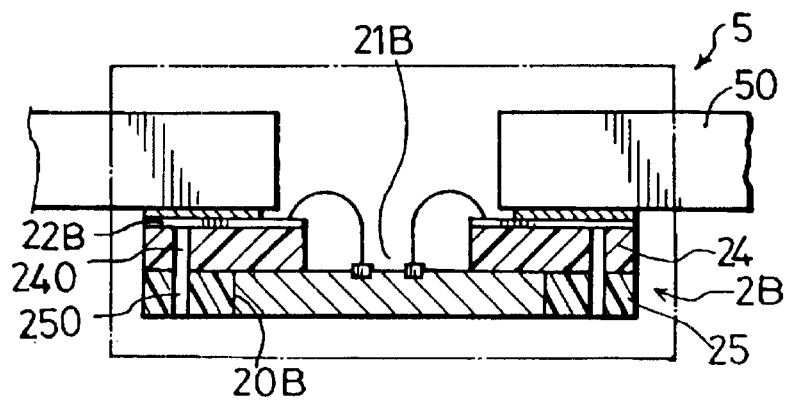
FIG. 4 is a fragmentary schematic, partly sectional view showing the third preferred embodiment of this invention.

FIG. 4 illustrates the third preferred embodiment of this invention, which is based on the first preferred embodiment. In FIG. 4, unlike the first preferred embodiment shown in FIG. 2D, the circuit board unit 2B includes a lower circuit board 25 formed with the die-receiving cavity 20B, and an upper circuit board 24 superimposed on the lower circuit board 25 and formed with the bore 21B. The upper circuit board 24 has the contact pads 22B formed on the top surface thereof, and is further formed with first electroplated holes 240 registered respectively with the contact pads 22B. The lower circuit board 25 is formed with second electroplated holes 250 registered respectively with the first electroplated holes 240. Thus, circuit traces (not shown) on the bottom side of the lower circuit board 25 can be connected to the leads 50 of the lead frame 5 via the holes 250, 240 and the contact pads 22B.

Figure 5:
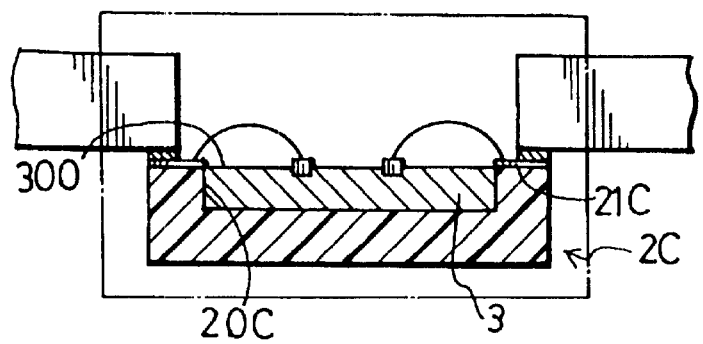
FIG. 5 is a fragmentary schematic, partly sectional view showing the fourth preferred embodiment of this invention.

FIG. 5 illustrates the fourth preferred embodiment of this invention, which is based on the first preferred embodiment. In FIG. 5, unlike the first preferred embodiment shown in FIG. 2D, the circuit board unit 2C has a top surface 21C formed with the die-receiving cavity 20C. The die 3 is placed in the die-receiving cavity 20C. The upper surface 300 of the die 3 is flush with the top surface 21C of the circuit board unit 2C.

FIG. 6 illustrates the fifth preferred embodiment of this invention, which is based on the fourth preferred embodiment. In FIG. 6, unlike the fourth preferred embodiment shown in FIG. 5, the circuit board unit 2D is further formed with a plurality of electroplated holes 23D registered respectively with the contact pads 22D and extending through a bottom surface of the circuit board unit 2D. The lead frame 5 is placed below the circuit board unit 2D. The conductive contact layer 51 is disposed between the lead frame 5 and the circuit board unit 2D to bond the leads 50 on the lead frame 5 onto the electroplated holes 23D to establish electrical connection with corresponding ones of the contact pads 22D.

FIG. 7 illustrates the sixth preferred embodiment of this invention, which is based on the fourth preferred embodiment. In FIG. 7, unlike the fourth preferred embodiment shown in FIG. 5, the circuit board unit 2E includes a lower circuit board 25E and an upper circuit board 24E superimposed on the lower circuit board 25E and formed with the die-receiving cavity 20E. The upper circuit board 24E has the contact pads 22E formed on a top surface 21E thereof, and is further formed with first electroplated holes 240E registered respectively with the contact pads 22E. The lower circuit board 25E is formed with second electroplated holes 250E registered respectively with the first electroplated holes 240E. Circuit traces (not shown) on the bottom side of the lower circuit board 25E can be connected to the contact pads 22E via the holes 250E, 240E.

Figure 9:
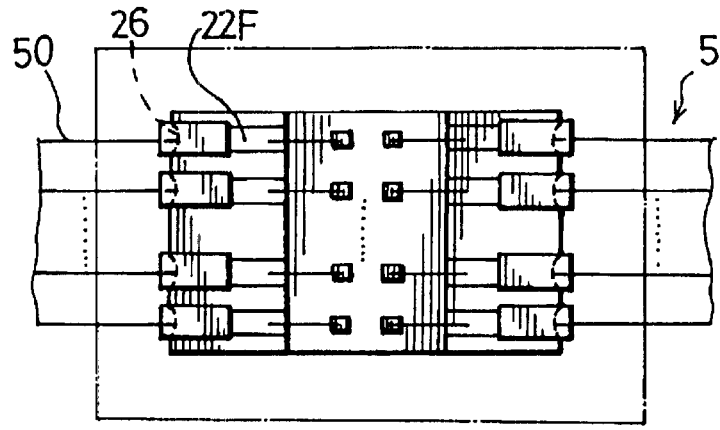
FIG. 9 is a fragmentary top view showing the seventh preferred embodiment of this invention.

FIGS. 8 and 9 illustrate the seventh preferred embodiment of this invention, which is based on the first preferred embodiment. In FIG. 8, unlike the first preferred embodiment shown in FIG. 2D, the circuit board unit 2F further has opposite side portions formed with a plurality of positioning notches 26 that correspond respectively to the contact pads 22F. Each of leads 50 on the lead frame 5 has one end inserted into a respective one of the positioning notches 26. The conductive contact layer 51 is used to bond the leads 50 on the lead frame 5 onto corresponding ones of the contact pads 22F. The height of the resulting integrated circuit chip can thus be reduced.

Figure 10:
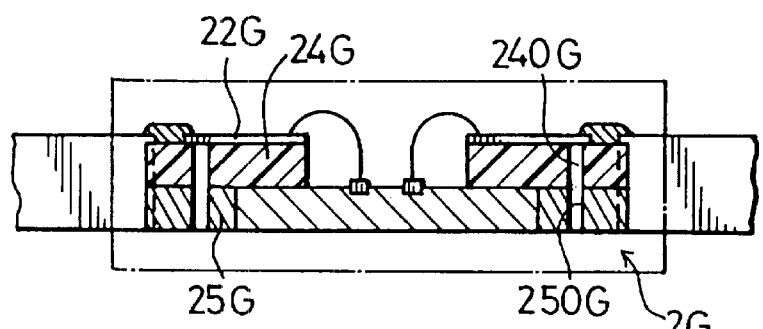
FIG. 10 is a fragmentary schematic, partly sectional view showing the eighth preferred embodiment of this invention.

FIG. 10 illustrates the eighth preferred embodiment of this invention, which is based on the seventh preferred embodiment. In FIG. 10, unlike the seventh preferred embodiment shown in FIG. 8, the circuit board unit 2G includes a lower circuit board 25G formed with the die-receiving cavity, and an upper circuit board 24G superimposed on the lower circuit board 25G and formed with the bore to access the die-receiving cavity. The upper circuit board 24G has the contact pads 22G on a top surface thereof, and is further formed with first electroplated holes 240G registered respectively with the contact pads 22G. The lower circuit board 25G is formed with second electroplated holes 250G registered respectively with the first electroplated holes 240G. Circuit traces (not shown) on the bottom side of the lower circuit board 25G can be connected to the contact pads 22G via the holes 250G, 240G.

Figure 11:
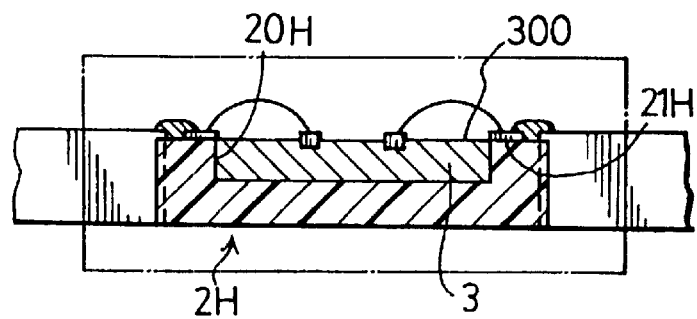
FIG. 11 is a fragmentary schematic, partly sectional view showing the ninth preferred embodiment of this invention.

FIG. 11 illustrates the ninth preferred embodiment of this invention, which is based on the seventh preferred embodiment. In FIG. 11, unlike the seventh preferred embodiment shown in FIG. 8, the circuit board unit 2H has a top surface 21H formed with the die-receiving cavity 20H. The die 3 is placed in the die-receiving cavity 20H. An upper surface 300 of the die 3 is flush with the top surface 21H of the circuit board unit 2H.

Figure 12:
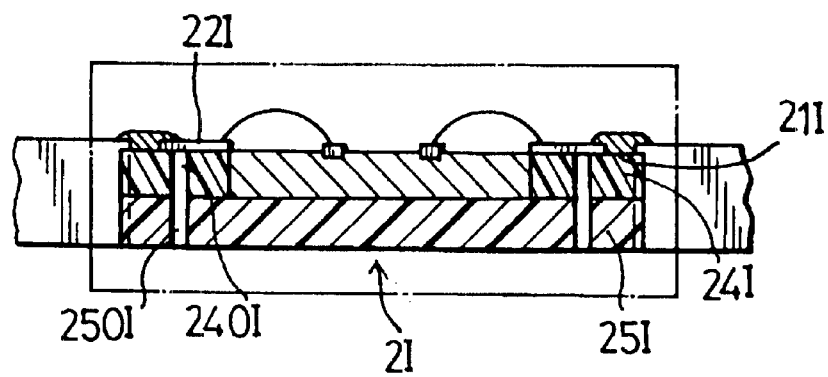
FIG. 12 is a fragmentary schematic, partly sectional view showing the tenth preferred embodiment of this invention.

FIG. 12 illustrates the tenth preferred embodiment of this invention, which is based on the ninth preferred embodiment. In FIG. 12, unlike the ninth preferred embodiment shown in FIG. 11, the circuit board unit 2I includes a lower circuit board 25I and an upper circuit board 24I superimposed on the lower circuit board 25I and formed with the die-receiving cavity 20I. The upper circuit board 24I has the contact pads 22I formed on a top surface 21I thereof, and is further formed with first electroplated holes 240I registered respectively with the contact pads 22I. The lower circuit board 25I is formed with second electroplated holes 250I registered respectively with the first electroplated holes 240I. Circuit traces (not shown) on the bottom side of the lower circuit board 25I can be connected to the contact pads 22I via the holes 250I, 240I.

Figure 13:
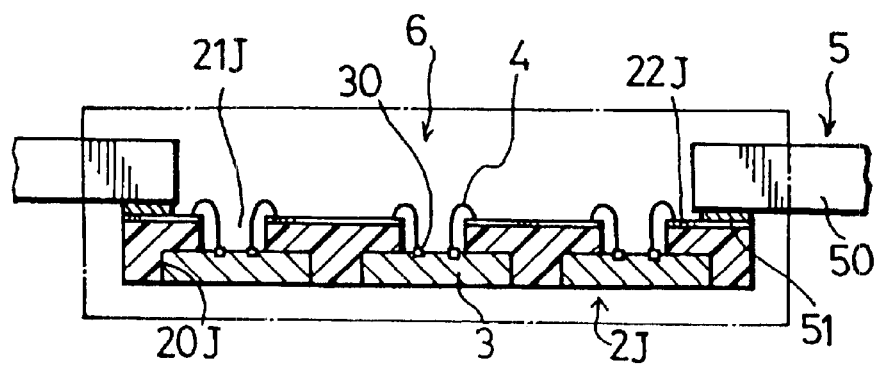
FIG. 13 is a fragmentary schematic, partly sectional view showing the eleventh preferred embodiment of this invention.

FIG. 13 illustrates the eleventh preferred embodiment of this invention. In this embodiment, a circuit board unit 2J has a bottom surface formed with a plurality of die-receiving cavities 20J, and a top surface formed with a plurality of bores 21J to access a respective one of the die-receiving cavities 20J and further formed with a plurality of contact pads 22J. Each of a number of dies 3 has an upper surface provided with a plurality of solder pads 30. Each of the dies 3 is placed in a respective one of the die-receiving cavities 20J such that the solder pads 30 on each of the dies 3 are exposed via a respective one of the bores 21J in the circuit board unit 2J. A plurality of conductive wires 4 extend through the bore 21J and wire-bond the solder pads 30J to the contact pads 22J. A lead frame 5 is placed on top of the circuit board unit 2J, and has a plurality of leads 50. A conductive contact layer 51 is disposed between the lead frame 5 and the circuit board unit 2J to bond the leads 50 on the lead frame 5 onto corresponding ones of the contact pads 22J. Finally, a plastic protective layer 6 is used to encapsulate the circuit board unit 2J and at least a portion of the lead frame 5. Thus, surface mounting steps are reduced to enhance the production capacity.

Figure 14:
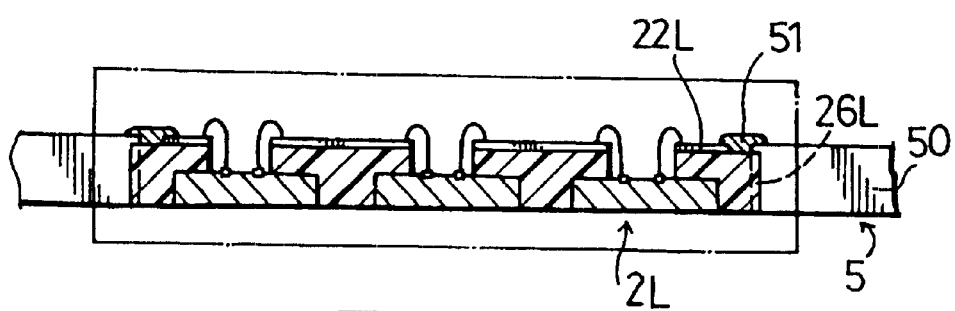
FIG. 14 is a fragmentary schematic, partly sectional view showing the twelfth preferred embodiment of this invention.

FIG. 14 illustrates the twelfth preferred embodiment of this invention, which is based on the eleventh preferred embodiment. In FIG. 14, unlike the eleventh preferred embodiment shown in FIG. 13, the circuit board unit 2L further has opposite side portions formed with a plurality of positioning notches 26L that correspond respectively to the contact pads 22L. Each of the leads 50 on the lead frame 5 has one end inserted into a respective one of the positioning notches 26L. The conductive contact layer 51 is used to bond the leads 50 on the lead frame 5 onto corresponding ones of the contact pads 22L.

FIG. 15 illustrates the thirteenth preferred embodiment of this invention, which is based on the eleventh preferred embodiment. In FIG. 15, unlike the eleventh preferred embodiment shown in FIG. 13, the circuit board unit 2M has a top surface 21M formed with a plurality of die-receiving cavities 20M. Each of the dies 3 is placed in a respective one of the die-receiving cavities 20M. An upper surface 300 of each die 3 is flush with the top surface 21M of the circuit board unit 2M.

FIG. 16 illustrates the fourteenth preferred embodiment of this invention, which is based on the thirteenth preferred embodiment. In FIG. 16, unlike the thirteenth preferred embodiment shown in FIG. 15, the circuit board unit 2N further has opposite side portions formed with a plurality of positioning notches 26N that correspond respectively to the contact pads 22N. Each of the leads 50 on the lead frame 5 has one end inserted into a respective one of the positioning notches 26N. A conductive contact layer 51 is used to bond the leads 50 on the lead frame 5 onto corresponding ones of the contact pads 22N.

FIG. 17 is illustrates the fifteenth preferred embodiment of this invention, which is based on the second preferred embodiment. In FIG. 17, unlike the second preferred embodiment shown in FIG. 3, there are first and second circuit board units 2P that are identical in construction. Each of the first and second circuit board units 2P has a bottom surface formed with a die-receiving cavity 20P, a top surface formed with a bore 21P to access the die-receiving cavity 20P, and a plurality of contact pads 22P on the top surface. Each of the first and second circuit board units 2P is further formed with a plurality of electroplated holes 23P registered respectively with the contact pads 22P and extending through the bottom surface thereof. The lead frame 5 is placed between the first and second circuit board units 2P. Each of two conductive contact layers 51 is disposed between the lead frame 5 and a respective one of the first and second circuit board units 2P to bond the leads 50 on the lead frame 5 onto respective ones of the electroplated holes 23P to establish electrical connection with corresponding ones of the contact pads 22P.

FIG. 18 is illustrates the sixteenth preferred embodiment of this invention, which is based on the fifth preferred embodiment. In FIG. 18, unlike the fifth preferred embodiment shown in FIG. 6, there are first and second circuit board units 2Q that are identical in construction. Each of the first and second circuit board units 2Q has a top surface formed with a die-receiving cavity 20Q and a plurality of contact pads 22Q, and a plurality of electroplated holes 23Q that are registered respectively with the contact pads 22Q and that extend through a bottom surface thereof. The lead frame 5 is placed between the first and second circuit board units 2P. Each of two conductive contact layers 51 is disposed between the lead frame 5 and a respective one of the first and second circuit board units 2P to bond the leads 50 on the lead frame 5 onto respective ones of the electroplated holes 23P to establish electrical connection with corresponding ones of the contact pads 22P.

FIG. 19 is illustrates the seventeenth preferred embodiment of this invention, which is based on the eleventh preferred embodiment. In FIG. 19, unlike the eleventh preferred embodiment shown in FIG. 13, the circuit board unit 2R is further formed with a plurality of electroplated holes 23R registered respectively with the contact pads 22R and extending through a bottom surface of the circuit board unit 2R. The lead frame 5 is placed below the circuit board unit 2R. The conductive contact layer 51 is disposed between the lead frame 5 and the circuit board unit 2R to bond the leads 50 on the lead frame 5 onto the electroplated holes 23R to establish electrical connection with corresponding ones of the contact pads 22R.

FIG. 20 is illustrates the eighteenth preferred embodiment of this invention, which is based on the seventeenth preferred embodiment. In FIG. 20, unlike the seventeenth preferred embodiment shown in FIG. 19, there are first and second circuit board units 2S that are identical in construction. Each of the first and second circuit board units 2S is formed with a plurality of electroplated holes 23S registered respectively with the contact pads 22S and extending through a bottom surface thereof. The lead frame 5 is placed between the first and second circuit board units 2S. Each of two conductive contact layers 51 is disposed between the lead frame 5 and a respective one of the first and second circuit board units 2S to bond the leads 50 on the lead frame 5 onto respective ones of the electroplated holes 23S to establish electrical connection with corresponding ones of the contact pads 22S.

Figure 21:
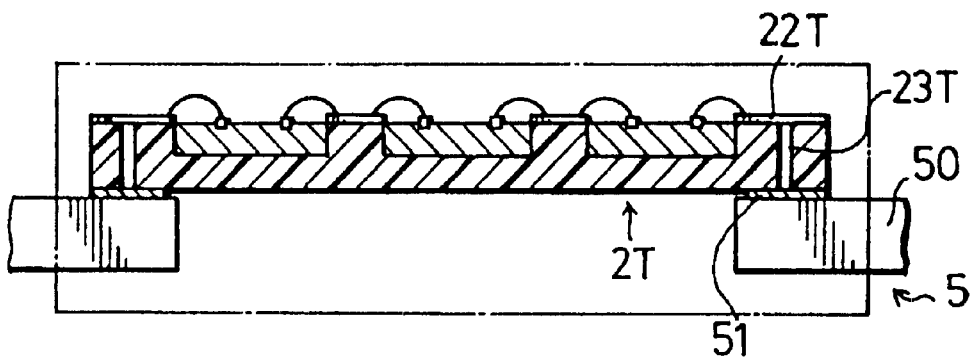
FIG. 21 is a fragmentary schematic, partly sectional view showing the nineteenth preferred embodiment of this invention.

FIG. 21 illustrates the nineteenth preferred embodiment of this invention, which is based on the thirteenth preferred embodiment. In FIG. 21, unlike the thirteenth preferred embodiment shown in FIG. 15, the circuit board unit 2T is further formed with a plurality of electroplated holes 23T registered respectively with the contact pads 22T and extending through a bottom surface of the circuit board unit 2T. The lead frame 5 is placed below the circuit board unit 2T. The conductive contact layer 51 is disposed between the lead frame 5 and the circuit board unit 2T to bond the leads 50 on the lead frame 5 onto the electroplated holes 23T to establish electrical connection with corresponding ones of the contact pads 22T.

Figure 22:
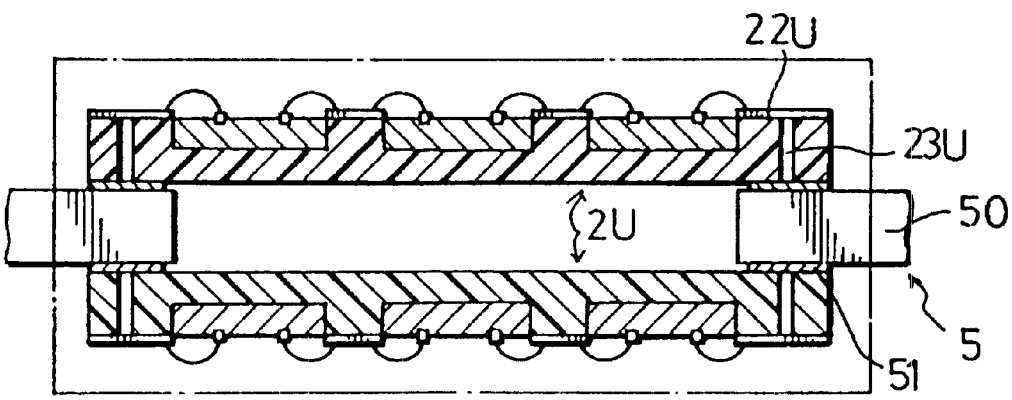
FIG. 22 is a fragmentary schematic, partly sectional view showing the twentieth preferred embodiment of this invention.

FIG. 22 is illustrates the twentieth preferred embodiment of this invention, which is based on the nineteenth preferred embodiment. In FIG. 22, unlike the nineteenth preferred embodiment shown in FIG. 19, there are first and second circuit board units 2U that are identical in construction. Each of the first and second circuit board units 2U is formed with a plurality of electroplated holes 23U registered respectively with the contact pads 22U and extending through a bottom surface thereof. The lead frame 5 is placed between the first and second circuit board units 2U. Each of two conductive contact layers 51 is disposed between the lead frame 5 and a respective one of the first and second circuit board units 2U to bond the leads 50 on the lead frame 5 onto respective ones of the electroplated holes 23U to establish electrical connection with corresponding ones of the contact pads 22U.

Figure 23:
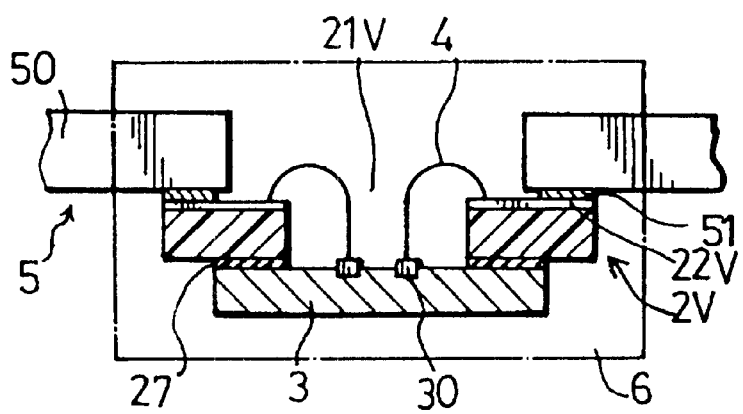
FIG. 23 is a fragmentary schematic, partly sectional view showing the twenty-first preferred embodiment of this invention.

FIG. 23 illustrates the twenty-first preferred embodiment of this invention. In this embodiment, a circuit board unit 2V has a top surface formed with a bore 21V and a plurality of contact pads 22V. A die 3 has an upper surface provided with a plurality of solder pads 30. The die 3 is attached to a bottom surface of the circuit board unit 2V by an adhesive layer 27 such that the solder pads 30 on the die 3 are exposed via the bore 21V in the circuit board unit 2V. A plurality of conductive wires 4 extend through the bore 21V and wire-bond the solder pads 30 to the contact pads 22V. A lead frame 5 is placed on top of the circuit board unit 2V and has a plurality of leads 50. A conductive contact layer 51 bonds the leads 50 on the lead frame 5 onto corresponding ones of the contact pads 22V. Finally, a plastic protective layer 6 is used to encapsulate the circuit board unit 2V and at least a portion of the lead frame 5.

Figure 24:
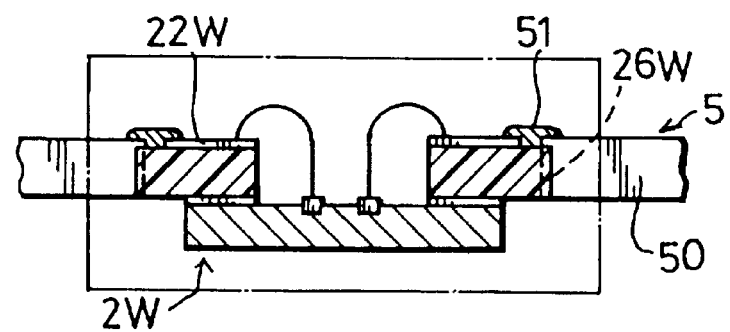
FIG. 24 is a fragmentary schematic, partly sectional view showing the twenty-second preferred embodiment of this invention.

FIG. 24 illustrates the twenty-second preferred embodiment of this invention, which is based on the twenty-first preferred embodiment. In FIG. 24, unlike the twenty-first preferred embodiment shown in FIG. 23, the circuit board unit 2W further has opposite side portions formed with a plurality of positioning notches 26W that correspond respectively to the contact pads 22W. Each of the leads 50 on the lead frame 5 has one end inserted into a respective one of the positioning notches 26W. A conductive contact layer 51 is used to bond the leads 50 on the lead frame 5 onto corresponding ones of the contact pads 22W.

Figure 25:
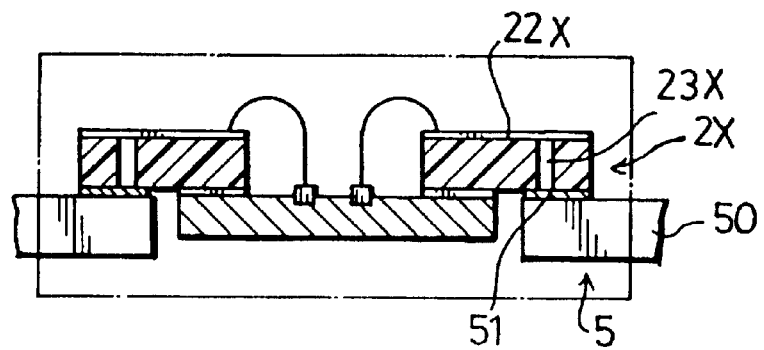
FIG. 25 is a fragmentary schematic, partly sectional view showing the twenty-third preferred embodiment of this invention.

FIG. 25 illustrates the twenty-third preferred embodiment of this invention, which is based on the twenty-first preferred embodiment. In FIG. 25, unlike the twenty-first preferred embodiment shown in FIG. 23, the circuit board unit 2X is further formed with a plurality of electroplated holes 23X registered respectively with the contact pads 22X and extending through a bottom surface of the circuit board unit 2X. The lead frame 5 is placed below the circuit board unit 2X. The conductive contact layer 51 is disposed between the lead frame 5 and the circuit board unit 2X to bond the leads 50 on the lead frame 5 onto the electroplated holes 23X to establish electrical connection with corresponding ones of the contact pads 22X.

Figure 26:
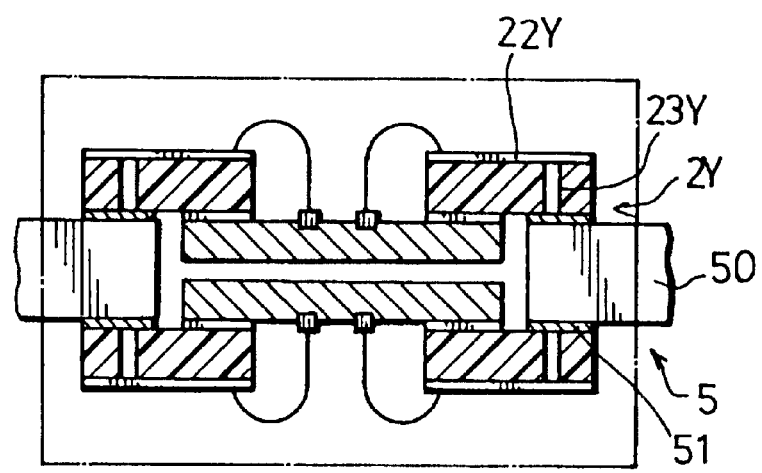
FIG. 26 is a fragmentary schematic, partly sectional view showing the twenty-fourth preferred embodiment of this invention.

FIG. 26 illustrates the twenty-fourth preferred embodiment of this invention, which is based on the twenty-third preferred embodiment. In FIG. 26, unlike the twenty-third preferred embodiment shown in FIG. 25, there are first and second circuit board units 2Y that are identical in construction. Each of the first and second circuit board units 2Y is formed with a plurality of electroplated holes 23Y registered respectively with the contact pads 22Y and extending through a bottom surface thereof. The lead frame 5 is placed between the first and second circuit board units 2Y. Each of two conductive contact layers 51 is disposed between the lead frame 5 and a respective one of the first and second circuit board units 2Y to bond the leads 50 on the lead frame 5 onto respective ones of the electroplated holes 23Y to establish electrical connection with corresponding ones of the contact pads 22Y.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An integrated circuit chip comprising:
    a circuit board unit having a bottom surface formed with a die-receiving cavity, a top surface formed with a bore to access said die-receiving cavity, and a plurality of contact pads on said top surface of said circuit board unit;
    a die having an upper surface provided with a plurality of solder pads, said die being placed inside said die-receiving cavity such that said solder pads are exposed via said bore in said circuit board unit;
    a plurality of conductive wires that extend through said bore and that wire-bond said solder pads to said contact pads;
    a lead frame placed on top of said circuit board unit, said lead frame having a plurality of leads;
    a conductive contact layer disposed between said lead frame and said circuit board unit to bond said leads on said lead frame onto corresponding ones of said contact pads; and
    a plastic protective layer to encapsulate said circuit board unit and at least a portion of said lead frame.

2. The integrated circuit chip of claim 1, wherein said conductive contact layer is formed from a silver epoxy.

3. The integrated circuit chip of claim 1, wherein said conductive contact layer is formed from solder paste.

4. The integrated circuit chip of claim 1, wherein said circuit board unit includes a lower circuit board formed with said die-receiving cavity, and an upper circuit board superimposed on said lower circuit board and formed with said bore, said upper circuit board being formed with first electroplated holes registered respectively with said contact pads, said lower circuit board being formed with second electroplated holes registered respectively with said first electroplated holes.

5. An integrated circuit chip comprising:
- a circuit board unit having a top surface formed with a die-receiving cavity and a plurality of contact pads;
- a die having an upper surface provided with a plurality of solder pads, said die being placed in said die-receiving cavity such that said solder pads are exposed from said die-receiving cavity;
- a plurality of conductive wires for wire-bonding said solder pads to said contact pads;
- a lead frame placed on top of said circuit board unit, said lead frame having a plurality of leads;
- a conductive contact layer disposed between said lead frame and said circuit board unit to bond said leads on said lead frame onto corresponding ones of said contact pads; and
- a plastic protective layer to encapsulate said circuit board unit and at least a portion of said lead frame.

6. The integrated circuit chip of claim 5, wherein said conductive contact layer is formed from a silver epoxy.

7. The integrated circuit chip of claim 5, wherein said conductive contact layer is formed from solder paste.

8. The integrated circuit chip of claim 5, wherein said circuit board unit includes a lower circuit board and an upper circuit board superimposed on said lower circuit board and formed with said die-receiving cavity, said upper circuit board being formed with first electroplated holes registered respectively with said contact pads, said lower circuit board being formed with second electroplated holes registered respectively with said first electroplated holes.

9. An integrated circuit chip comprising:
- a circuit board unit having a top surface formed with a bore and a plurality of contact pads;
- a die having an upper surface provided with a plurality of solder pads, said die being attached to a bottom surface of said circuit board unit such that said solder pads on said die are exposed via said bore in said circuit board unit;
- a plurality of conductive wires that extend through said bore and that wire-bond said solder pads to said contact pads;
- a lead frame placed on top of said circuit board unit, said lead frame having a plurality of leads;
- a conductive contact layer that bonds said leads on said lead frame onto corresponding ones of said contact pads; and
- a plastic protective layer to encapsulate said circuit board unit and at least a portion of said lead frame.

10. The integrated circuit chip of claim 9, wherein said conductive contact layer is formed from a silver epoxy.

11. The integrated circuit chip of claim 9, wherein said conductive contact layer is formed from solder paste.

12. An integrated circuit chip comprising:
- a circuit board unit having a bore, a top surface formed with a plurality of contact pads, and opposite side portions formed with a plurality of positioning notches that correspond respectively to said contact pads;
- a die having an upper surface provided with a plurality of solder pads, said die being attached onto a bottom surface of said circuit board unit such that said solder pads on said die are exposed via said bore in said circuit board unit;
- a plurality of conductive wires that extend through said bore and that wire-bond said solder pads to said contact pads;
- a lead frame having a plurality of leads, one end of each of said leads being inserted into a respective one of said positioning notches;
- a conductive contact layer that bonds said leads on said lead frame onto corresponding ones of said contact pads adjacent to said opposite side portions of said circuit board unit; and
- a plastic protective layer to encapsulate said circuit board unit and at least a portion of said lead frame.

13. The integrated circuit chip of claim 12, wherein said conductive contact layer is formed from a silver epoxy.

14. The integrated circuit chip of claim 12, wherein said conductive contact layer is formed from solder paste.

* * * * *